(12) United States Patent
Wohlgenannt et al.

(10) Patent No.: US 10,718,866 B2
(45) Date of Patent: Jul. 21, 2020

(54) LASER DISTANCE MEASURING MODULE WITH ADC ERROR COMPENSATION BY VARIATION OF THE SAMPLING INSTANTS

(71) Applicant: HEXAGON TECHNOLOGY CENTER GMBH, Heerbrugg (CH)

(72) Inventors: Rainer Wohlgenannt, Klaus (AT); Simon Bestler, Langenargen (DE); Jürg Hinderling, Marbach (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 247 days.

(21) Appl. No.: 15/834,907

(22) Filed: Dec. 7, 2017

(65) Prior Publication Data
US 2018/0172831 A1    Jun. 21, 2018

(30) Foreign Application Priority Data
Dec. 21, 2016    (EP) .................................... 16206010

(51) Int. Cl.
*G01S 17/10*    (2020.01)
*H03M 1/06*    (2006.01)
*G01S 7/4865*    (2020.01)

(52) U.S. Cl.
CPC ............ *G01S 17/10* (2013.01); *G01S 7/4865* (2013.01); *H03M 1/0624* (2013.01)

(58) Field of Classification Search
CPC ...................................................... G01S 17/10
USPC ........................................................ 702/159
See application file for complete search history.

(56) References Cited

U.S. PATENT DOCUMENTS

| 8,576,116 B2 * | 11/2013 | Matsuo .................. G01S 7/282 342/145 |
| 2011/0098970 A1 | 4/2011 | Hug et al. |
| 2014/0307248 A1 * | 10/2014 | Giger ..................... G01S 17/10 356/5.01 |
| 2014/0368364 A1 | 12/2014 | Hsu |
| 2015/0116695 A1 * | 4/2015 | Bartolome ............. G01S 17/10 356/5.05 |
| 2017/0328988 A1 * | 11/2017 | Magee .................. G01S 7/4815 |
| 2018/0172805 A1 | 6/2018 | Bestler et al. |

FOREIGN PATENT DOCUMENTS

| EP | 1 832 897 B1 | 11/2010 |
| EP | 3 339 885 A1 | 6/2018 |

OTHER PUBLICATIONS

EP Search Report dated Jun. 20, 2017 as received in Application No. 16206010.7.

* cited by examiner

*Primary Examiner* — Ricky Ngon
(74) *Attorney, Agent, or Firm* — Maschoff Brennan

(57) ABSTRACT

A distance measuring method and an electronic laser distance measuring module, in particular for use in a distance measuring apparatus, especially configured as a laser tracker, tachymeter, laser scanner, or profiler, for fast signal detection with an analog-to-digital converter, wherein conversion errors that arise in the context of a signal digitization, in particular timing, gain and offset errors of the ADC, are compensated for by means of variation of the sampling instants.

13 Claims, 6 Drawing Sheets

LASER DISTANCE MEASURING MODULE WITH ADC ERROR COMPENSATION BY VARIATION OF THE SAMPLING INSTANTS

CROSS-REFERENCE TO RELATED APPLICATIONS

This application claims priority to European Patent Application No. 16206010.7 filed on Dec. 21, 2016. The foregoing patent application are incorporated herein by reference.

FIELD OF THE INVENTION

The present invention relates to a distance measuring method and an electronic laser distance measuring module. More particularly, the present invention relates is for use in a distance measuring apparatus, e.g. in a laser tracker, tachymeter, laser scanner, or profiler, for fast signal detection with an analog-to-digital converter (ADC), wherein conversion errors that arise in the context of a signal digitization, in particular timing, gain and offset errors of the ADC, are compensated for by means of variation of the sampling instants.

BACKGROUND

Various principles and methods are known in the field of electronic and electro-optical distance measurement. One approach consists in emitting pulsed electromagnetic radiation, such as e.g. laser light, onto a target to be measured and in receiving an echo from said target as a backscattering object, wherein the distance to the target to be measured can be determined for example on the basis of the time of flight, the shape, and/or the phase of the pulse. Such laser distance measuring devices have gained acceptance in the meantime as standard solutions in many fields.

Two different approaches or a combination thereof are usually used for detecting the backscattered pulse.

The so-called threshold value method involves detecting a light pulse if the intensity of the radiation incident on a detector of the distance measuring apparatus used exceeds a certain threshold value. Said threshold value prevents noise and interference signals from the background from being erroneously detected as a useful signal, i.e. as backscattered light of the emitted pulse. The other approach is based on the sampling of the backscattered pulse. This approach is typically used in the case of weak backscattered signals (e.g. pulse signals), such as are caused for example by relatively large measurement distances, or generally for increasing the measurement accuracy. An emitted signal is detected by virtue of the fact that the radiation detected by a detector is sampled, a signal is identified within the sampled region and, finally, a position of the signal is determined temporally. By using a multiplicity of samples and/or summation of the reception signal synchronously with the emission rate, it is possible to identify a useful signal even under unfavorable circumstances, such that it is possible to cope with even relatively large distances or background scenarios that are noisy or beset by disturbances.

Nowadays, the entire waveform of the analog signal of the radiation detected by a detector is often sampled here by means of the waveform digitizing (WFD) method. After identification of the coding of the associated transmission signal (ASK, FSK, PSK, etc.) of a received signal, a signal time of flight ("pulse time of flight") is determined very accurately from a defined profile point of the sampled, digitized and reconstructed signal, for example the points of inflection, the curve maxima, or integrally by means of an optimum filter known from the time interpolation.

As an alternative or in addition to determining the pulse time of flight, a (fast) sampling is often also effected with regard to pulses or pulse sequences coded or modulated in terms of amplitude, phase, polarization, wavelength and/or frequency.

In the approach of temporally very precise sampling of the backscattered signal, the electrical signal generated by the detector is converted into a digital signal sequence by means of an analog-to-digital converter (ADC). Said digital signal is then usually processed further in real time. In a first step, the signal, often modulated as a pulse, is identified by specific digital filters and, finally, its position within the signal sequence is determined. By using a multiplicity of sampled pulse sequences, it is possible to identify a useful signal even under unfavorable circumstances, such that it is possible to cope with even relatively large distances or background scenarios that are noisy or beset by disturbances.

One of the simplest types of modulation is the identification of the individual pulses or pulse sequences by distance coding, as described e.g. in EP 1 832 897 B1. This is used for example for the purpose of re-identifiability. This re-identification is necessary if an ambiguity arises, which may be brought about by various situations during the time-of-flight measurement of pulses, for example if more than one pulse or a pulse group is situated between measuring apparatus and target object.

In fast analog-to-digital converters (ADC), the high sampling rate in conjunction with a high resolution of the signal amplitude (e.g. 1 GS/s, 14-bit) is achieved for example by the generation of a plurality of ADC conversion stages, for example by:

- temporally interleaving ("interleave") a plurality of slow ADC conversion stages,
- quantizing the sampled signal amplitudes in stages ("pipeline", "pipelining"), or
- in combination multi-stage quantization of the signal samples of a plurality of ADC conversion stages.

In the case of these architectures, architecture-typical errors arise despite careful internal corrections. Said errors vary over time and temperature.

In the case of interleaved ADCs, the errors arise in particular by virtue of the fact that the different ADC conversion stages do not have exactly identical properties with regard to offset, gain and timing. As a result, the typical errors are manifested in particular as:

- skew (timing error between the sample instants of the different ADC conversion stages or ADCs);
- gain (different gain factor between the internal ADC core components. The signal is usually amplified and/or buffered in the ADC);
- offset (different DC levels of the internal outputs of the ADC conversion stages).

In the case of pipelined ADCs, the typical errors are usually manifested as differential nonlinearity DNL and integral nonlinearity INL. DNL and INL are errors during the conversion of the analog signal values into digital (integral) values, for example brought about by the quantization in stages in a pipeline ADC with steps becoming finer and finer/resolution becoming higher and higher.

The INL error is essentially the partial sum of all the contributions of the DNL errors below the signal level to be converted and can attain a plurality of LSBs ("Least Significant Bits"). Therefore, even in the case of moderate fluctuations of the signal values, the INL error, in particular, has serious effects on the digitized signal waveform accuracy. The digitized signal waveform no longer corresponds to the original analog signal waveform. By means of internal corrections in the ADC component, these DNL and INL errors can be partly minimized, but not eliminated, and an external calibration, which may be realized by measuring and recording the residual error, is variable over time and for example highly temperature-dependent.

During the distance measurement, over distance periodic distance errors in the distance of the sampling/sample pattern arise as a result of the errors of the individual ADC conversion stages. The edges of a digital signal pulse are corrupted by the conversion errors in the excursion, as a result of which the position of the signal pulse can be shifted with respect to the time axis. Errors in the measurement distance can occur even in distance measuring systems having start and stop pulses or start and stop signal sequences. By way of example, this is the case if the start pulse has an amplitude in the medium modulation range, whereas the stop pulse has an amplitude in the lower amplitude range, wherein as a result of an INL-dictated shape distortion, for example, both pulses are deformed differently and the absolute distance is corrupted.

SUMMARY

Therefore, one object of some embodiments of the invention is to provide an improved distance measurement with at the same time a high measurement accuracy and a high distance resolution.

In this case, one specific object of some embodiments of the invention is to provide an improved method and an improved system for signal digitization.

A further specific object of some objects of the invention, moreover, is to provide an improved error compensation in fast ADCs, in particular for interleaved ADCs.

These objects are achieved by the realization of the characterizing features of the independent claims. Features that develop the invention in an alternative or advantageous way can be gathered from the dependent patent claims.

Some embodiments of the invention relate to a distance measuring method, in particular for a laser distance measuring apparatus, especially configured as a laser tracker, tachymeter, laser scanner, or profiler, for determining a distance to a target object comprising emitting transmission signals, in particular pulsed transmission signals, as a transmission signal series; receiving at least portions of the transmission signals of the transmission signal series reflected at the target object as reception signals of a reception signal series; digitizing the reception signals of the reception signal series into digital signals of a digital signal series by means of an analog-to-digital converter, referred to hereinafter as ADC, in particular of the interleaved ADC or pipelined ADC type, with an ADC sampling pattern generated by at least two ADC conversion stages; and processing the digital signal series in order to derive the distance to the target object therefrom; in particular wherein the determination of the distance is based on the pulse time-of-flight method.

Directly after a recording of a reception signal has started, the ADC constantly supplies digital values each having a temporal spacing of a clock period, and this hardware-dictated ADC sampling pattern defines an initial signal sampling pattern of a reception signal. The transmission signal is repeated a number of times or repetitively, this transmission signal series is sampled in a temporally continuously shifted manner and secondary signal sampling patterns arise. This plurality of secondary digital reception signals exhibit different relative temporal positions within the ADC clock interval. If the quotient between the temporal shift and the clock interval is a rational number, then the oversampling is repeated after a defined time and comprises a defined number of reception signals sampled with an identical phase. This has the advantage that these signals of identical type can be jointly processed, for example accumulated, and can then be treated as a single finely sampled reception signal in the evaluation. In this case, the errors resulting from ADC conversion errors largely cancel one another out, wherein it is crucial, in particular, to consider the relative temporal shift of the transmission pulse with respect to the sampling pattern in the context of the number of ADC conversion stages, for example in the sense that identical sampling points of the transmission pulses are detected by a plurality of ADC conversion stages.

An alternative evaluation method is processing, in particular accumulation, on the basis of all the initial and secondary digital signal sequences in such a way that the corresponding samples of all the secondary digital signals which are shifted by less than plus/minus half a clock interval with respect to the samples of the initial digital signal are processed (e.g. accumulated) and as a result an averaging is effected, for example, which greatly reduces the error influences of the ADC or of individual ADC conversion stages. This evaluation method is also expedient if the quotient between the temporal shift and the clock interval is an irrational number. This evaluation method therefore functions for all settings of the asynchronism between the clock of the transmitting unit and the clock of the receiving electronics.

According to the present invention, the ADC sampling pattern defines with respect to a reception signal an initial signal sampling pattern with at least one initial sampling point of the reception signal (wherein the clock period of the initial signal sampling pattern is typically given by a hardware-dictated working cycle of the ADC conversion stages), and the reception signals of the reception signal series are temporally shifted relative to the ADC sampling pattern by means of a first temporal shift in such a way that the at least one initial sampling point is detected at least once by a first ADC conversion stage and at least once by a second ADC conversion stage; in particular wherein the reception signals of the reception signal series are additionally temporally shifted relative to the ADC sampling pattern by means of a second temporal shift such that in a defined sampling range around the at least one initial sampling point a multiplicity of secondary sampling points of the reception signals arise, said secondary sampling points being shifted in each case by a fraction of the period duration of the ADC clock signal, and this results in the sampling of different signal positions around the at least one initial sampling point with a varying signal value.

ADC conversion errors, for example timing, gain, offset or INL errors, can vary very greatly locally with the ADC sampling sequence, thereby giving rise to a distance measurement error that is periodic with the ADC sampling sequence.

As a result of the multiplicity of samplings of different signal positions with a varying amplitude (signal strength) of the respectively digitized signal value, the actual ADC measurement signal is shifted around the at least one initial sampling point over a range of values, as a result of which different signal-value-dependent error zones of an ADC conversion error are swept over. As a result of the processing of a plurality of reception signals, for example an averaging or a summation, and thus of a multiplicity of secondary samplings around the initial sampling point, an averaging over different error contributions of ADC conversion errors thus automatically arises.

As a result of the sampling of the at least one initial sampling point and, if appropriate, the secondary samplings (secondary sampling points) by a plurality of ADC conversion stages ("mixing of the ADC conversion stages") there is mixing of the error contributions of the ADC conversion stages for example in the sampling range around the initial sampling point, as a result of which a sufficient error cancelation is already ensured after a small number of signal pulses and after a short measurement time.

In one specific embodiment, the transmission signals are emitted on the basis of a transmission clock (having a fixed transmission clock frequency) and the reception signals are detected on the basis of an ADC clock, wherein at least one of the following conditions is met in the context of a measuring process: the transmission clock is asynchronous with respect to the ADC clock; the period duration of the transmission clock and/or a period duration of the transmission signals are/is different than the period duration of the ADC clock signal or than an integral multiple of the period duration of the ADC clock signal; and the transmission period $T_s$ ($=1/f_s$) corresponding to the transmission clock frequency and/or to a repetition rate of the transmission signals $f_s$ is given as $T_s=(n+q)*T_{ADC}$, wherein n is an integer, q is a fractional number having an absolute value of <1, and $T_{ADC}$ is the period duration of the ADC clock signal (the ADC sampling period corresponding to the ADC clock frequency $f_{ACD}$, $T_{ADC}=1/f_{ADC}$), wherein for a number of ADC conversion stages c used the condition n modulo c≠0 is met.

As described above, a compensation of the errors resulting from ADC conversion errors is crucially dependent on identical sampling points of the transmission pulses being detected—at best a number of times—by a plurality of ADC conversion stages, as a result of which the ADC conversion errors largely cancel one another out. In particular, it is thus crucial to consider the relative temporal shift of the transmission pulse with respect to the sampling pattern in the context of the number of ADC conversion stages.

A further embodiment of the invention is therefore characterized in that the reception signals of the reception signal series are shifted relative to the ADC sampling pattern with a defined number of first temporal shifts, wherein the number of first temporal shifts is set on the basis of at least one element of the following group: a defined minimum number of samplings of the at least one initial sampling point by each of the ADC conversion stages used; a defined measurement accuracy for the determination of the distance; a measured signal value of the reception signal; and the predefined measurement time.

An average ADC conversion error can vary for example as a function of an average signal value over different value ranges, e.g. in the sense that the (local) ADC conversion error is greater for example for a range having a higher average amplitude than for a range of lower average amplitude. Furthermore, the minimization of the local error, that is to say also the distance measurement accuracy achieved, is crucially dependent on the value range over which the actual measurement signal is varied (and thus averaged).

A further embodiment is therefore characterized in that the reception signals of the reception signal series are shifted relative to the ADC sampling pattern with a defined number of second temporal shifts, as a result of which the sampling range is sampled with a defined number of secondary sampling points, wherein the number of secondary sampling points is set on the basis of at least one element of the following group: a defined minimum number of secondary sampling points, in particular on the basis of a minimum number of samplings of each secondary sampling point by each of the ADC conversion stages used; a defined measurement accuracy for the determination of the distance; a measured signal value of the reception signal; and a predefined measurement time.

A further aspect relates in particular to distance measurements based on the "start-stop" principle, where both the signal sequence of the emitted pulse and the reception signal sequence of the reflected pulse are sampled and taken into account in the context of the distance measurement. By contrast, in "stop-only" measurements, the instant at which the transmission pulse is emitted is known, for example by virtue of a system clock, wherein only the reflected signal of the reception signal sequence is sampled.

In the measuring method with start-stop sampling, as a result of the known shift of the transmission instant, for example on the basis of a system clock, and an additional determination of the transmission instant by means of a sampling of a transmission signal or of the transmission signal series, possible non-compensated or non-compensable residual errors, in particular timing errors, can be determined and it is thereby possible to apply additional corrections in the context of the determination of the instant or of the distance, derived from the reception signal sequence of the reflected pulse.

Consequently, a further specific embodiment of the invention relates for example to the fact that at least portions of the transmission signals as reference signals of a reference signal series pass via a reference section having a known, invariable length and are digitized by means of the ADC, in particular by means of reflection at the target object at a known, invariable distance or without prior reflection at the target object, especially wherein the reference section extends completely within the laser distance measuring apparatus, wherein the ADC sampling pattern defines with respect to a reference signal an initial reference sampling pattern with at least one initial reference sampling point of the reference signal, and the reference signals of the reference signal series are shifted relative to the ADC sampling pattern by means of the first temporal shift, such that the at least one initial reference sampling point is detected at least once by the first ADC conversion stage and at least once by the second ADC conversion stage; in particular wherein the reference signals of the reference signal series are additionally temporally shifted relative to the ADC sampling pattern by means of the second temporal shift such that in a defined sampling range around the at least one initial reference sampling point a multiplicity of secondary reference sampling points of the reference signals arise, said secondary reference sampling points being shifted in each case by a fraction of the period duration of the ADC clock signal, and this results in the sampling of different signal positions around the at least one initial reference sampling point with a varying signal value.

On account of this reference sampling, a reference transmission instant for the transmission signal series can be derived on the basis of the digitized reference signals; a system transmission instant for the transmission signal series can be derived on the basis of a system clock; and on the basis of the reference transmission instant and the system transmission instant reference time information for a determination of the first and/or second temporal shift can be derived, which is taken into account during a determination of a reception instant of the reception signal series and/or the determination of the distance to the target object. In a further embodiment, the relative temporal shifts are generated by means of shifting the transmission instants of the transmission signals, and/or by means of shifting the sampling instants of the reception signals.

In many distance measuring methods, for example also by means of WFD, periodically individual laser pulses or groups of short laser pulses are emitted. By way of example, the pulse rate is a few kHz to several MHz, wherein the pulse rate is derived from a higher-frequency oscillator, for example, from which the clock frequency of the analog-to-digital converter is also derived. The temporal shift of the emission instant of the laser signal can be set by means of a digital phase shifter in the trigger channel of the transmitting unit.

There are known, for example, electronic phase shifter modules at 12 GHz having a phase resolution of four to eight bits and a phase stability of better than four degrees, which at 12 GHz corresponds to a time jitter of 0.9 psec for example.

The temporal shift of the transmission signal with respect to the receiver unit can thus be set and varied in a simple manner. In the case of short measurement times, where only a small number of signal sequences are recorded, the time jitter downstream of the phase shifting unit could be excessively great. However, said time jitter can be sufficiently reduced for example by means of a PLL (phase-locked loop) connected downstream.

A further embodiment relates to the fact that the transmission signals are emitted on the basis of a transmission clock (having a fixed transmission clock frequency) and an initial relative emission instant of a transmission signal is defined relative to the transmission clock, and/or the reception signals are detected on the basis of a reception clock (having a fixed reception clock frequency) and an ADC clock for the control of the ADC for detecting a sequence of reception signals is defined by the reception clock, wherein at least one secondary relative emission instant of the transmission signal that is temporally shifted with respect to the initial relative emission instant is generated by means of a first phase shifter, and/or the ADC clock is temporally shifted relative to the reception clock by means of a second phase shifter.

Some embodiments of the invention furthermore relate to an electronic laser distance measuring module, in particular for use in a distance measuring apparatus, especially configured as a laser tracker, tachymeter, laser scanner, or profiler, for determining a distance to a target object comprising an optical transmission channel having a transmitting unit for generating transmission signals of a transmission signal series, in particular by means of pulsed laser measurement radiation; an optical reception channel having a receiving unit for receiving at least portions of the transmission signals of the transmission signal series reflected at the target object as reception signals of a reception signal series; a reception circuit for digitizing the reception signals of the reception signal series into digital signals of a digital signal series with an analog-to-digital converter, referred to as ADC hereinafter, in particular of the interleaved ADC or pipelined ADC type, with an ADC sampling pattern generated by at least two ADC conversion stages; and a supervisory and control unit for determining the distance to the target object on the basis of a processing of the digital signal series; in particular wherein the determination of the distance is based on the pulse time-of-flight method.

According to some embodiments of the present invention, the laser distance measuring module is configured in such a way that the ADC sampling pattern defines with respect to a reception signal an initial signal sampling pattern with at least one initial sampling point of the reception signal, and the reception signals of the reception signal series are temporally shifted relative to the ADC sampling pattern by means of a first temporal shift in such a way that the at least one initial sampling point is detected at least once by a first ADC conversion stage and at least once by a second ADC conversion stage; in particular wherein the reception signals of the reception signal series are additionally temporally shifted relative to the ADC sampling pattern by means of a second temporal shift such that in a defined sampling range around the at least one initial sampling point a multiplicity of secondary sampling points of the reception signals arise, said secondary sampling points being shifted in each case by a fraction of the period duration of the ADC clock signal, and this results in the sampling of different signal positions around the at least one initial sampling point with a varying signal value.

By way of example, the transmitting unit and the receiving unit can be configured in such a way that a laser pulse trigger and an ADC clock are generated asynchronously by two independent clock generators. Alternatively, by way of example, the laser pulse trigger and the ADC clock can be generated from the same clock generator, for example by means of one or more phase-locked loops (PLL, e.g. integer PLL or fractional PLL).

Furthermore, the sampling instants can be varied for example by settable (very small) delays, for example by means of a phase shifter, wherein for example the frequency of the ADC clock corresponds to a multiple of the frequency of the transmission clock.

In accordance with a further embodiment, the laser distance measuring module is configured in such a way that the transmission signals are emitted on the basis of a transmission clock and the reception signals are detected on the basis of an ADC clock, wherein at least one of the following conditions is met in the context of a measuring process: the transmission clock is asynchronous with respect to the ADC clock; the period duration of the transmission clock and/or a period duration of the transmission signals are/is different than the period duration of the ADC clock signal or than an integral multiple of the period duration of the ADC clock signal; and the transmission period $T_s$ corresponding to the transmission clock frequency and/or to a repetition rate of the transmission signals is given as $T_s=(n+q)*T_{ADC}$, wherein n is an integer, q is a fractional number having an absolute value of between −1 and +1, and $T_{ADC}$ is the period duration of the ADC clock signal, wherein for a number of ADC conversion stages c used the condition n modulo c≠0 is met.

In one specific embodiment, the laser distance measuring module is configured in such a way that the reception signals of the reception signal series are shifted relative to the ADC sampling pattern with a defined number of first temporal shifts, wherein the number of first temporal shifts is set on the basis of at least one element of the following group: a defined minimum number of samplings of the at least one initial sampling point by each of the ADC conversion stages used; a defined measurement accuracy for the determination of the distance; a measured signal value of the reception signal; and a predefined measurement time.

In particular, the laser distance measuring module in accordance with a further embodiment is configured in such a way that the reception signals of the reception signal series are shifted relative to the ADC sampling pattern with a defined number of second temporal shifts, as a result of which the sampling range is sampled with a defined number of secondary sampling points, wherein the number of secondary sampling points is set on the basis of at least one element of the following group: a defined minimum number of mutually different secondary sampling points, in particular on the basis of a minimum number of samplings of each secondary sampling point by each of the ADC conversion stages used; a defined measurement accuracy for the determination of the distance; a measured signal value of the reception signal; and a predefined measurement time.

In a further embodiment, the laser distance measuring module is configured in such a way that at least portions of the transmission signals as reference signals of a reference signal series pass via a reference section having a known, invariable length and are digitized by means of the ADC, in particular by means of reflection at the target object at a known, invariable distance or without prior reflection at the target object, especially wherein the reference section extends completely within the laser distance measuring apparatus, wherein the ADC sampling pattern defines with respect to a reference signal an initial reference sampling pattern with at least one initial reference sampling point of the reference signal, and the reference signals of the reference signal series are shifted relative to the ADC sampling pattern by means of the first temporal shift, such that the at least one initial reference sampling point is detected at least once by the first ADC conversion stage and at least once by the second ADC conversion stage; in particular wherein the reference signals of the reference signal series are additionally temporally shifted relative to the ADC sampling pattern by means of the second temporal shift such that in a defined sampling range around the at least one initial reference sampling point a multiplicity of secondary reference sampling points of the reference signals arise, said secondary reference sampling points being shifted in each case by a fraction of the period duration of the ADC clock signal, and this results in the sampling of different signal positions around the at least one initial reference sampling point with a varying signal value.

On account of this reference sampling, a reference transmission instant for the transmission signal series can be derived on the basis of the digitized reference signals; a system transmission instant for the transmission signal series can be derived on the basis of a system clock; and on the basis of the reference transmission instant and the system transmission instant reference time information for a determination of the first and/or second temporal shift can be derived, which is taken into account during a determination of a reception instant of the reception signal series and/or the determination of the distance to the target object.

In a further embodiment, the laser distance measuring module is configured in such a way that the relative temporal shifts are generated by means of shifting the transmission instants of the transmission signals, and/or by means of shifting the sampling instants of the reception signals.

A further embodiment relates to the fact that the transmission signals are emitted on the basis of a transmission clock and an initial relative emission instant of a transmission signal is defined relative to the transmission clock, and/or the reception signals are detected on the basis of a reception clock and an ADC clock for the control of the ADC for detecting a sequence of reception signals is defined by the reception clock, wherein at least one secondary relative emission instant of the transmission signal that is temporally shifted with respect to the initial relative emission instant is generated by means of a first phase shifter, and/or the ADC clock is temporally shifted relative to the reception clock by means of a second phase shifter.

The distance measuring method according to the invention and the laser distance measuring module according to the invention are described in greater detail purely by way of example below on the basis of exemplary embodiments that are illustrated schematically in the drawings. In the figures, identical elements are identified by identical reference signs. The embodiments described are generally not illustrated as true to scale, nor should they be understood as a restriction.

Specifically,

DETAILED DESCRIPTION

Figure 1A:
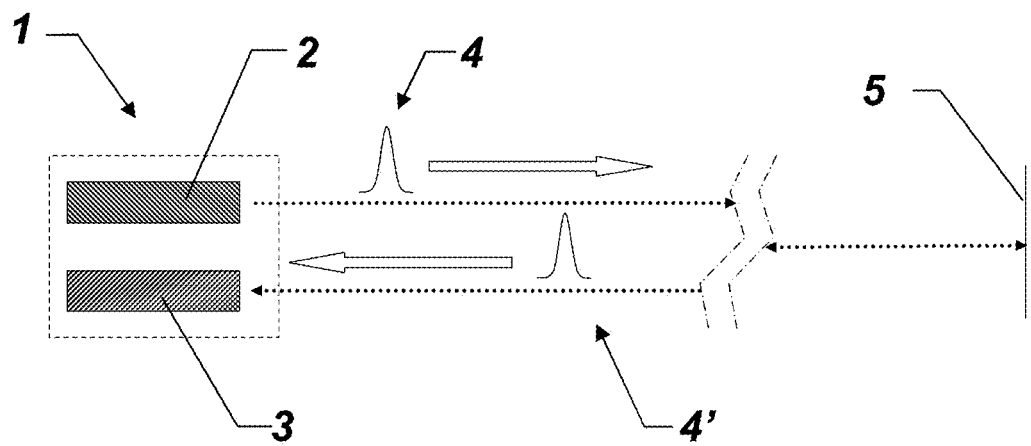
FIGS. 1a, b show a schematic illustration of the pulse time-of-flight method in an electro-optical distance measuring apparatus according to the prior art.
Figure 1B:
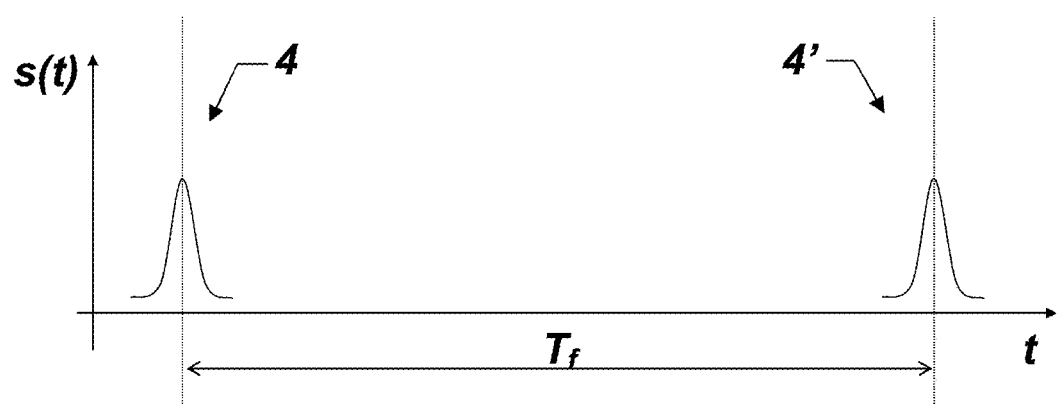

FIGS. 1a and 1b illustrate the pulse time-of-flight principle such as is used in typical electro-optical distance measuring apparatuses according to the prior art.

FIG. 1a shows a basic illustration of an electro-optical distance measuring device 1 from the prior art according to the pulse time-of-flight principle. A transmitter 2 and a receiver 3 are arranged in the distance measuring device 1. The transmitter 2 emits a light pulse 4, which, after reflection or backscattering at a target, e.g. a cooperative target object such as a retroflector 5 or an uncooperative target object such as a natural surface, is detected again as a backscattered light pulse 4' by the receiver 3. A continuously modulated transmission signal is often also used instead of the light pulses.

As elucidated schematically in FIG. 1b, the distance is ascertained from the time of flight $T_f$ as a temporal difference between the start instant of the emission of a light pulse 4 and the reception instant of the backscattered light pulse 4'. In this case, the reception instant is ascertained by the evaluation of a feature of the signal pulse s(t), e.g. by a signal threshold being exceeded or—as in the present invention—by the sampling of the signal pulse, wherein after identification of the coding of the associated transmission signal of a received signal, a pulse time of flight is determined very accurately from a defined profile point of the sampled and digitized signal, for example the points of inflection, the curve maxima, or integrally by means of an optimum filter known from the time interpolation. A further method for determining a defined profile point e.g. also comprises converting the reception signal into a bipolar signal and subsequently determining the zero crossing.

In the approach of temporally precise sampling of the backscattered pulse, the electrical signal generated by the detector is converted into a digital signal sequence by means of an analog-to-digital converter (ADC), said digital signal then usually being processed further in real time. By using a multiplicity of sample sequences and/or summation of the reception signal synchronously with the emission rate, it is possible to identify a useful signal even under unfavorable circumstances, such that it is possible to cope with even relatively large distances or background scenarios that are noisy or beset by disturbances.

In fast analog-to-digital converters (ADC), the high sampling rate in conjunction with a high resolution of the signal values is achieved for example by a plurality of ADC conversion stages, for example by temporally interleaving ("interleave") a plurality of slow ADCs or ADC conversion stages and/or by quantizing in stages ("pipeline", "pipelining"). In this case, architecture-typical errors arise despite careful internal corrections, which errors vary over time and for example temperature.

In the case of interleaved ADCs, the errors arise in particular by virtue of the fact that the different ADC conversion stages do not have exactly identical properties with regard to offset, gain and timing.

In the case of pipelined ADCs, the typical errors are usually manifested as differential nonlinearity DNL and integral nonlinearity INL. DNL and INL are errors during the conversion of the analog signal values into digital (integral) values, for example brought about by the quantization in stages in a pipelined ADC with steps becoming finer and finer/resolution becoming higher and higher.

Figure 2A:
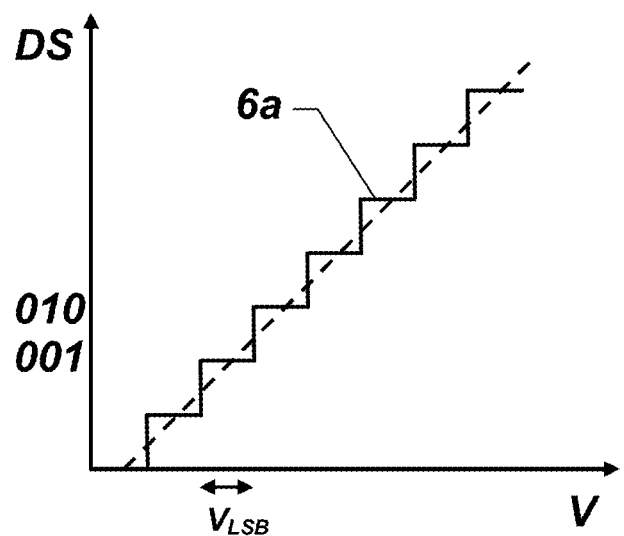
FIGS. 2a, b show a basic illustration of a digitization by an analog-to-digital converter (ADC) with a linear relationship between the ADC input signal and the digitized output values (a) and with a differential nonlinearity (b)
Figure 2B:
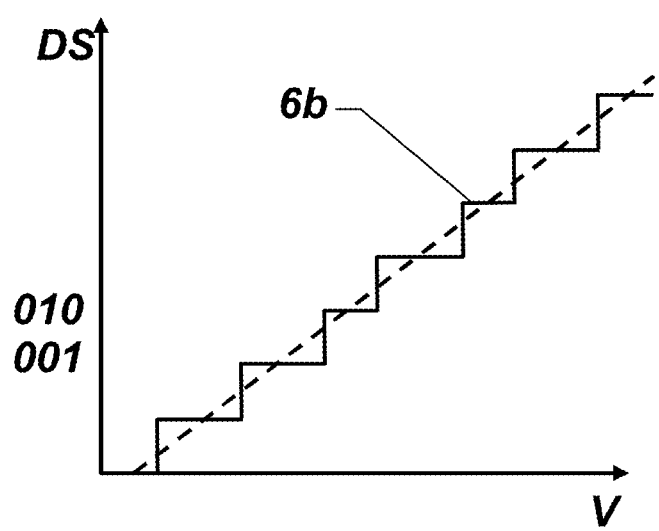

FIGS. 2a and 2b illustrate the effect of a differential nonlinearity DNL during a digitization by an analog-to-digital converter (ADC). The figures in each case show a plot for the generated digital signal DS as a function of the voltage V of an analog ADC input signal.

FIG. 2a illustrates the ideal case, wherein the digitization is effected in such a way that the difference between the threshold voltage and the next digital value is constant, that is to say that a linear digitization with a digitization step function 6a is generated, the step width $V_{LSB}$ of which is constant. In each case two neighboring digital values, e.g. the digital values 001 and 010, thus correspond to two converted analog input voltages with a separation between them of exactly one setpoint voltage $V_{LSB}$ ("Least Significant Bit").

In contrast thereto, FIG. 2b shows the effect of a differential nonlinearity DNL, wherein now in each case neighboring digital values, for example the digital values 001 and 010, correspond to analog input voltages which have a voltage difference that is less or greater than the setpoint voltage $V_{LSB}$. This produces a nonlinear digitization with a digitization step function 6b having a varying step width.

The INL error is essentially the sum of all the DNL errors cumulated up to the voltage value V of the input signal and can attain a plurality of LSBs. Therefore, even in the case of moderate fluctuations of the signal value, the INL error, in particular, has serious effects on the digitized signal waveform accuracy and as a result of the INL error over distance a periodic distance error in the distance of the sampling pattern arises during the distance measurement.

Figure 3:
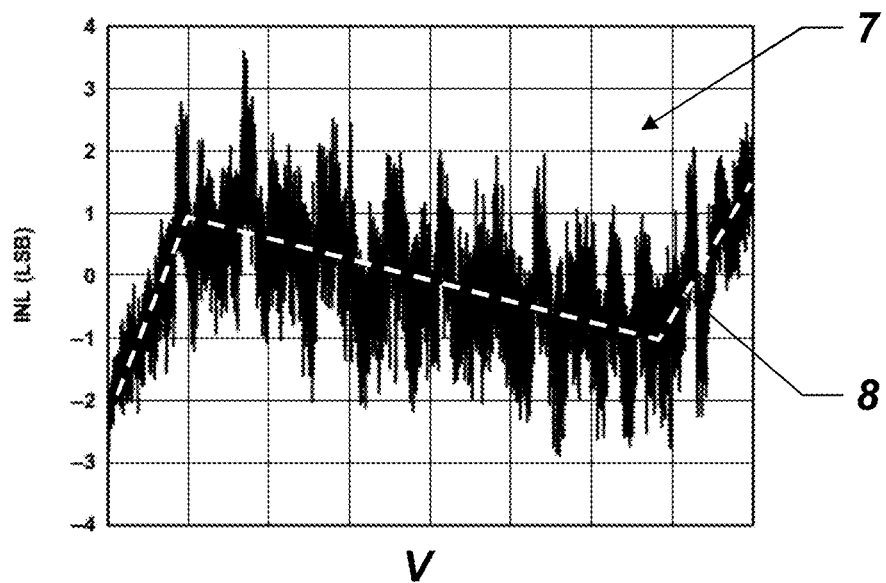
FIG. 3 shows a typical error curve for an integral nonlinearity of a fast ADC.

FIG. 3 shows a typical error curve 7 for an integral nonlinearity INL, for example of a fast interleave ADC architecture or of a pipeline ADC. The INL error curve 7 shows the deviation of the digitized value from the ideal setpoint value expressed in LSB units as a function of the ADC input voltage V.

The global profile of the INL error curve 7 (typically an S-shape) is represented here by a zigzag line 8 having three different gradients, for the sake of simplicity. If the sampled voltage values of a reception signal remain within an INL range having a substantially linear gradient value, then this generates an amplitude-dependent signal gain, which leads to a distortion of the pulse shape and reduces the distance measurement accuracy. If the sampled signal waveform comprises relatively great deviations from an average, linear gradient range of the INL curve (the signal waveform comprises e.g. a "kink" of the zigzag line 8), then further distortions arise on the signal waveform and the accuracy of a distance measurement exhibits cyclic errors with respect to the sampling pattern.

A local curvature of the INL error curve 7 (the local excursions/deviations of the INL error curve 7 from the global profile 8) generates a distance measurement error which for example is at least singly periodic with respect to the sampling pattern. Said local excursions of the INL curve considerably influence the distance measurement accuracy. The local curvature of the INL error curve and the distance measurement error that arises as a result are likewise corrected by the features of the present invention.

Figure 4A:
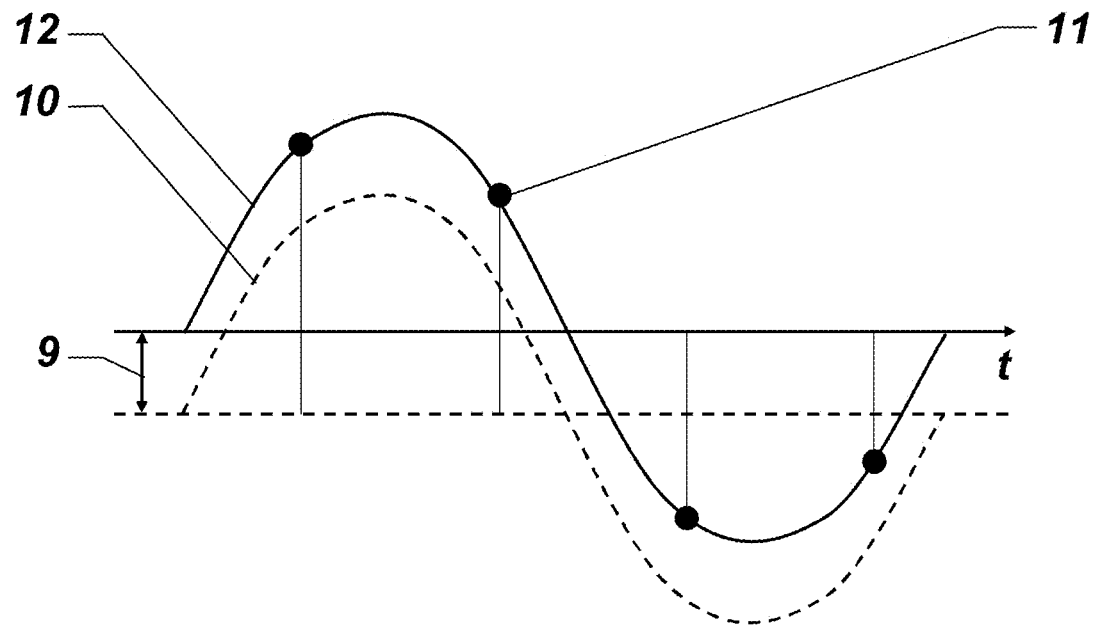
FIGS. 4a-c show an illustration of offset, timing and gain properties/errors of individual ADC conversion stages (e.g. ADC cores)
Figure 4B:
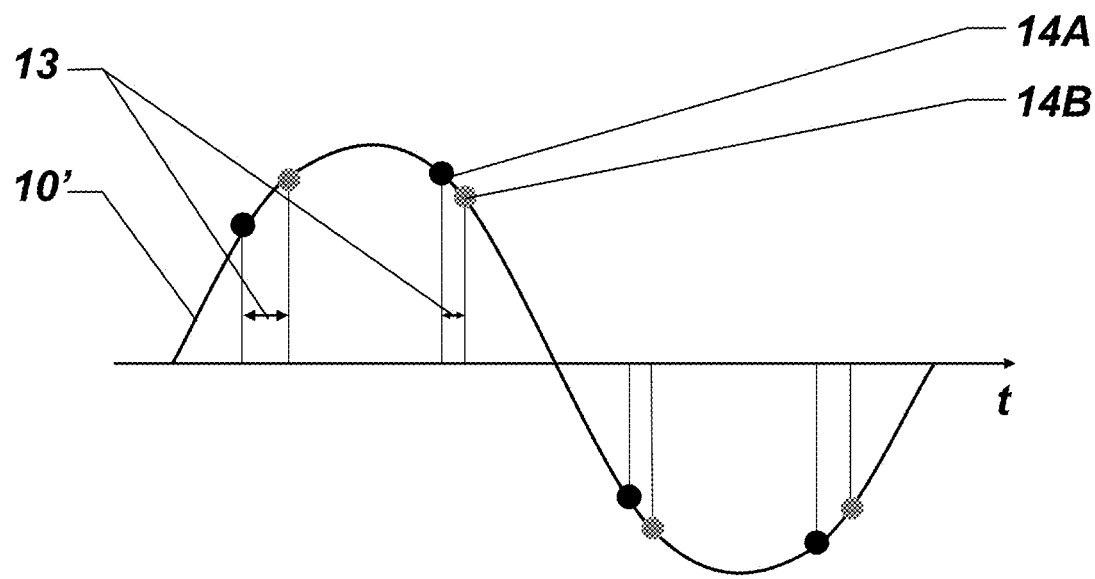
Figure 4C:
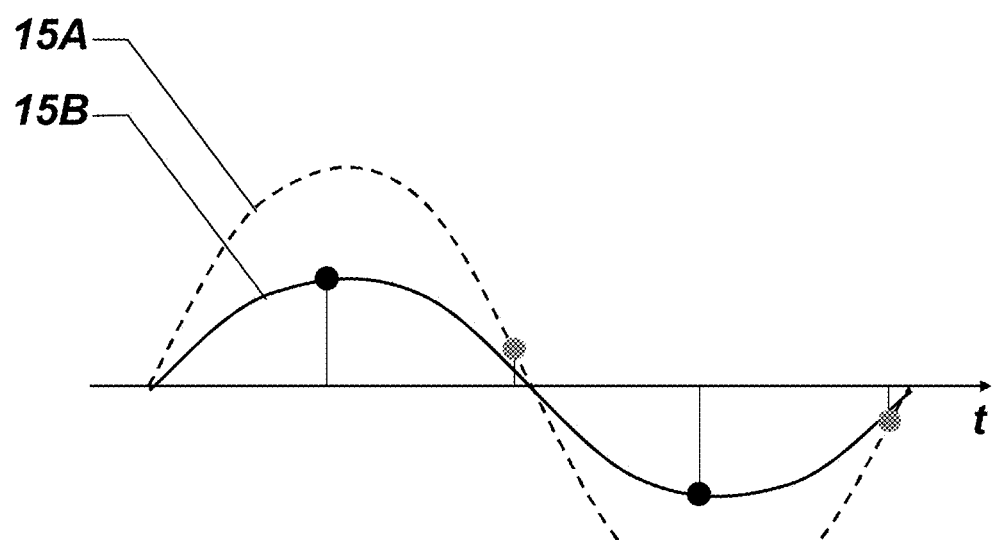

FIGS. 4a to 4c illustrate offset, timing and gain properties/errors of individual ADC conversion stages, for example of individual ADC cores in interleaved ADCs, which may differ slightly from ADC core to ADC core.

FIG. 4a illustrates an offset error 9, often also referred to as a zero error, during the conversion of an incoming analog signal 10 into digitized values 11, from which in turn an output signal 12 is derived. The offset error 9 indicates how well a current digitization step function 6a (see FIG. 2a) reproduces the ideal transfer function at an individual point. In the case of an ideal ADC, the first conversion takes place at 0.5 LSB, wherein a zero voltage is applied to the incoming analog signal 10. Depending on the setting of the zero voltage, external influences, for example temperature, and also internal properties of the electronics, the voltage levels of the internal outputs of the ADC conversion stages then differ for example in the case of interleaved ADCs.

FIG. 4b illustrates a timing error 13, also referred to as skew, which arises by virtue of the fact that the relative sample intervals of the different ADC conversion stages or ADCs for the sampling of the analog signal 10' differ, as a result of which the analog signal 10' is sampled with a non-uniform sampling pattern. As a result, distortions on the signal waveform arise during the reconstruction of the analog signal 10' from the values 14A, 14B digitized by the different ADC conversion stages.

FIG. 4c illustrates a gain error, for example in the case of interleaved ADCs. The gain error of an ADC or of an ADC conversion stage is a multiplicative error and describes the proportional relationship between ADC input voltage and ADC output signal, i.e. how well the gradient of an effective digitization step function 6a (see FIG. 2a) reproduces the ideal transfer function. Typically, the incoming signal is amplified or buffered in the ADC. As a result of different gain factors of the internal ADC core components, the digitized signal waveform is distorted since the different ADC core components represent differently amplified analog signals 15A, 15B.

According to the present invention, by means of temporal shifts of the reception signal series relative to the ADC sampling pattern by at least one initial sampling point, a multiplicity of samplings of different signal positions with a varying signal value are generated, in particular temporal shifts which are shorter than a clock interval of the ADC sampling pattern, and for example averaged, wherein inter alia an INL error and, in particular in the case of interleaved ADCs, e.g. timing errors and also gain and offset differences of the ADC conversion stages are averaged and reduced.

Figure 5:
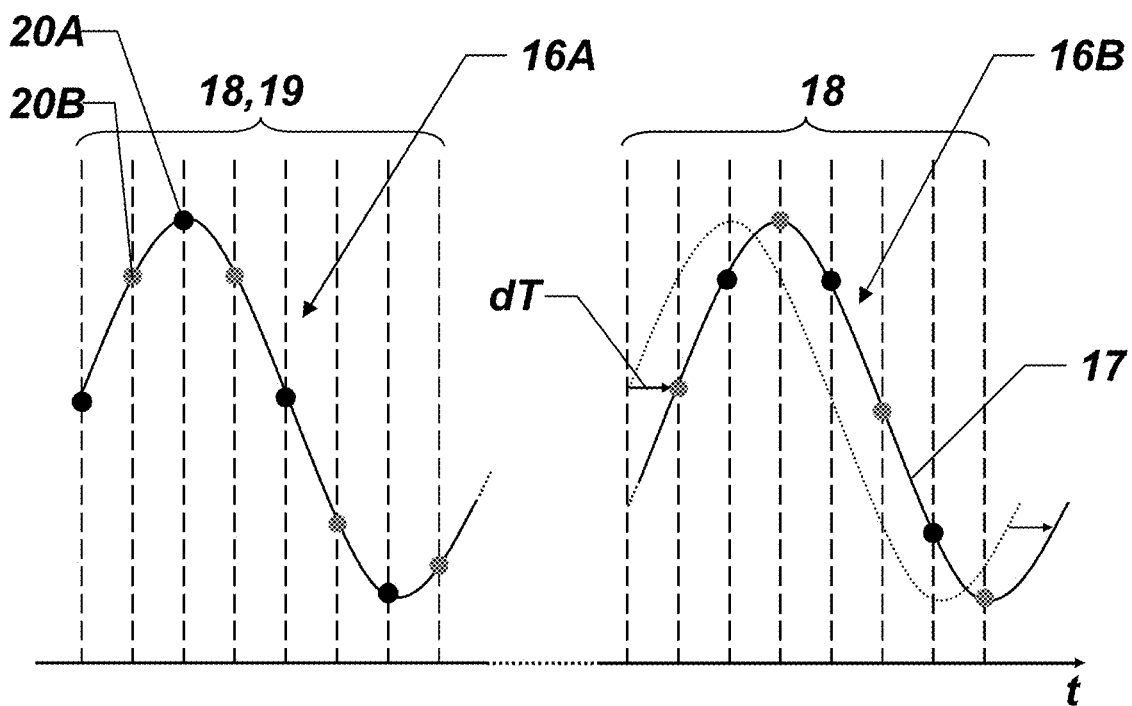
FIG. 5 shows an illustration of a temporal shift of the reception signal series in accordance with one concept of the present invention.

FIG. 5 illustrates a relative temporal shift according to the invention of a reception signal 16A of the reception signal series 17 with respect to an ADC sampling pattern 18 into a reception signal 16B temporally shifted with respect to the here fixed ADC sampling pattern 18, wherein here the ADC sampling pattern 18 is generated by an ADC having two conversion stages. As a result, for example by means of the arrangement of the ADC sampling pattern 18 with respect to the reception signal 16A at the start instant of the measurement, there is defined an initial signal sampling pattern 19 having initial sampling points 20A, B, with respect to the reception signal 16A, wherein here the initial sampling points are assigned alternately to a first 20A and a second 20B ADC conversion stage.

As a result of the relative temporal shift dT, here by exactly one clock cycle of the ADC sampling pattern 18 ("first" temporal shift), for example as a result of a temporal shift of the transmission instants of the transmission signals, for example by virtue of the laser being operated with a different frequency or asynchronously with respect to the ADC sampling, the individual reception signals are sampled at the respective initial sampling points 20A, B in each case alternately by the first and second conversion stages.

In addition, by way of example, an ("apparent", see below) relative temporal shift smaller than the clock interval of the ADC clock signal 18 can be generated ("second" temporal shift, not illustrated), as a result of which the individual reception signals are "shifted" within a defined temporal range around the respective initial sampling points 20A, B over the ADC sampling pattern 18. As a result, each pulse is sampled around the initial sampling points 20A, B additionally with a multiplicity of secondary samplings shifted in each case by a fraction of the period duration of the ADC clock signal, wherein, by virtue of the secondary sampling points, different signal positions around the initial sampling points 20A, B with a varying amplitude (varying signal value) are digitized and for example averaged.

Fractional relative temporal shifts which are apparently smaller than the clock interval (the period duration) of the ADC sampling pattern 18 can be generated for example by virtue of the temporal distance between individual signals of a transmission signal sequence being for example n+q clock intervals of the receiving unit, wherein n is an integer and q<1. The relative temporal shift of the secondarily sampled reception signal is then smaller than a clock interval of the initially sampled reception signal, even if n is for example 555.

If the architecture of the ADC converter comprises c conversion stages, then it is furthermore advantageous, for example, if in the expression n+q the number n modulo c=r is not equal to 0. If this is applicable, then the effective temporal shift is r+q clock intervals and the reception signal is shifted in the ADC from conversion stage m to conversion stage m+r. An optimum setting is present e.g. if (n modulo c)=1 or c−1 holds true. Two examples are described for example in FIG. 6.

By sweeping over different amplitudes (signal values), i.e. different error zones of the ADC conversion stage, the INL error influence and the influence of timing errors and also gain and offset differences on a distance measurement are significantly reduced for example by means of an averaging over a number of reception signals.

An alternative solution for the specific compensation of the INL error contribution, taking account of the same concept of amplitude variation, is described for example in the European application "Laser distance measuring module with INL error compensation" (application number EP16205847.3), which was filed on the same date by the same applicant.

Figure 6A:
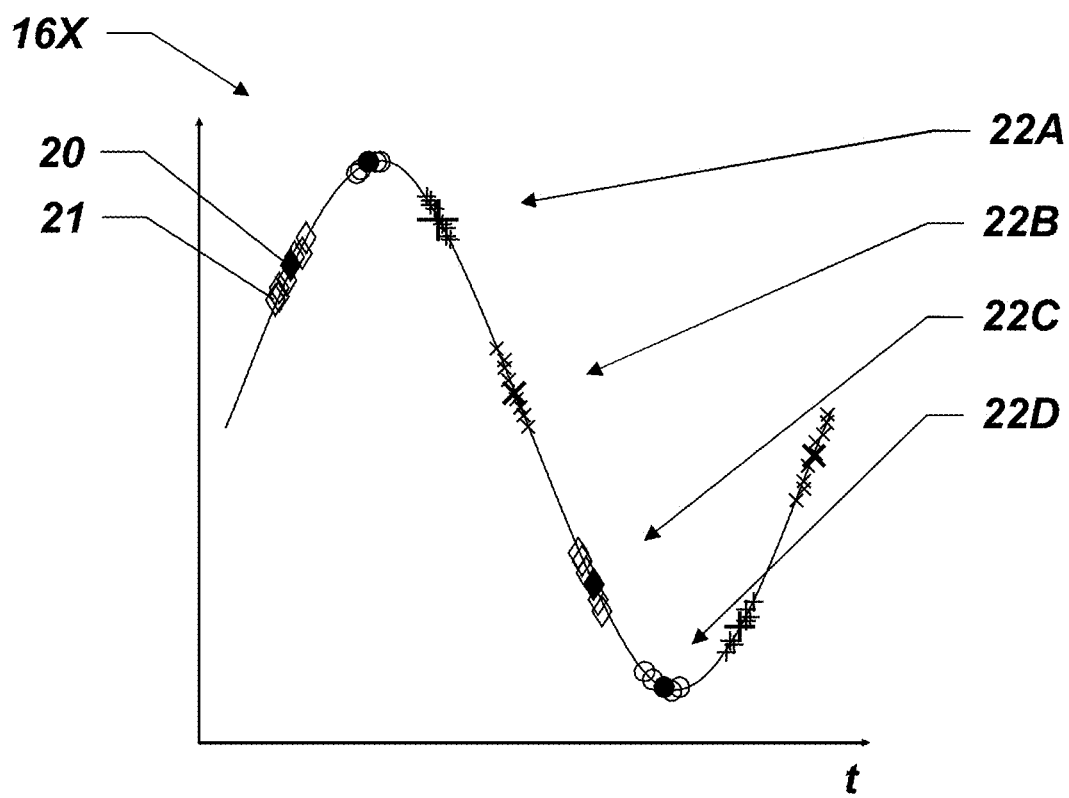
FIGS. 6a, b show an illustration of an averaging over a plurality of temporally shifted reception signals, with temporal shifts in each case smaller than the ADC clock interval (a) and additional shifts by integral multiples of the ADC clock interval (b).

FIG. 6a illustrates an averaging over a plurality of identical reception signals 16X ("single shots") of a reception signal series, here for example processed by means of four different ADC conversion stages, for example four different ADC conversion stages 22A, 22B, 22C, 22D in an interleaved architecture.

According to the present invention, the single shots are emitted for example in such a way that the reception signals are sampled at the initial sampling points 20 in each case with a multiplicity of additional secondary sampling points 21 arranged around the initial sampling points 20 within a defined sampling range, wherein the secondary sampling points 21 differ from the associated initial sampling point in each case merely by a fraction of the ADC clock interval (referred to above as "second" temporal shift). This is e.g. the case if the temporal distance n+q (see description above concerning FIG. 5) between individual signals of the transmission signal sequence in comparison with the here c=4 conversion stages of the ADC converter fulfils the relation n modulo c=0, which means, therefore, that the secondary sampling points are sampled over a plurality of transmission signal sequences, more precisely 1/q thereof, by the same assigned conversion stage. After a sufficient number of received transmission signals, a sufficient error cancelation arises here, particularly if the subsamples of each initial sampling point have passed through a defined value range of the reception signals 16X.

Figure 6B:
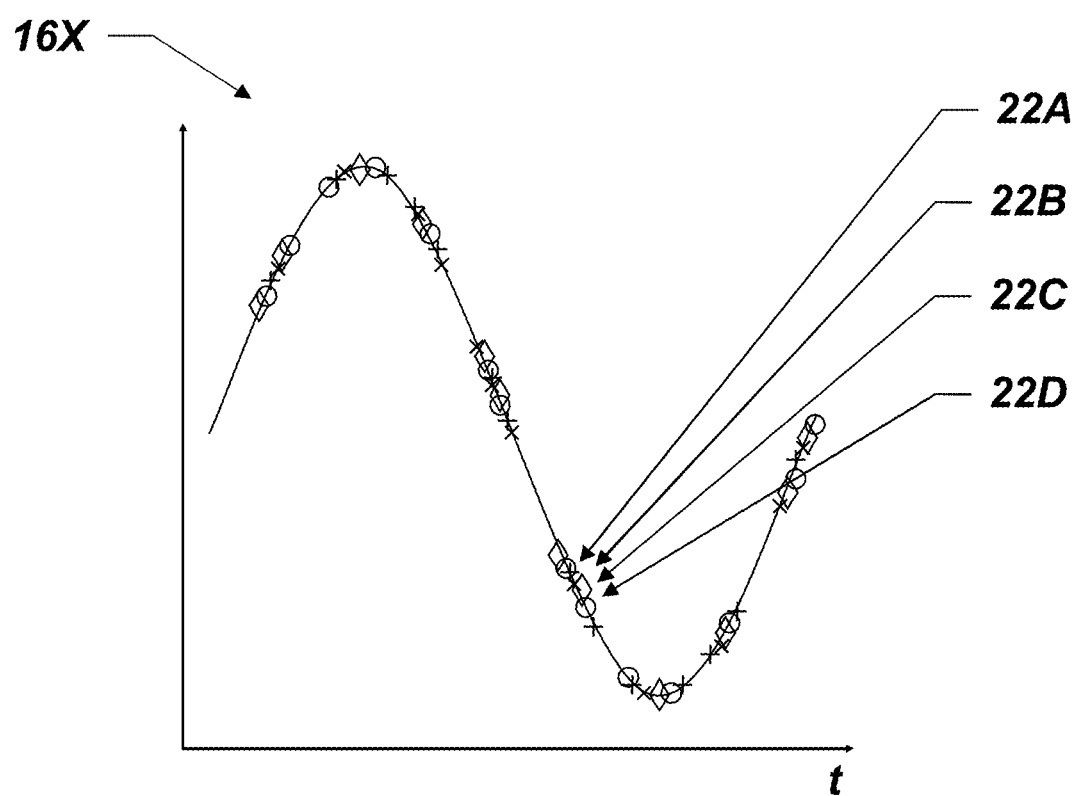

As is illustrated in FIG. 6b, it is advantageous, moreover, in particular in order, for a predefined error cancelation, for example, to significantly shorten the number of signal pulses required for an averaging and therefore the measurement times, to shift the individual signal pulses 16X in each case in addition to the continuous shift (above "second" temporal shift, <clock interval) by an integral multiple of the clock interval from conversion stage to conversion stage of the ADC (referred to above as "first" temporal shift).

An effective temporal shift is achieved, for example, if in the expression n+q the number n modulo c=r is not equal to 0. An optimum setting for the transmission signal period is present for example at n modulo c=1 or =c−1, which means that corresponding secondary sampling points are shifted from conversion stage to conversion stage and sampled. As a result, the subsamples 22A, 22B, 22C, 22D assigned to the ADC conversion stages are already mixed after a small number of signal pulses and a sufficient error cancelation is already ensured after short measurement times.

It goes without saying that said figures illustrated only schematically illustrate possible exemplary embodiments. The various approaches can likewise be combined with one another and also with methods from the prior art.

What is claimed is:

1. A distance measuring method for determining a distance to a target object, the method comprising:
    emitting transmission signals as a transmission signal series;
    receiving at least portions of the transmission signals of the transmission signal series reflected at the target object as reception signals of a reception signal series;

digitizing the reception signals of the reception signal series into digital signals of a digital signal series by means of an analog-to-digital converter (ADC) with an ADC sampling pattern generated by at least two ADC conversion stages; and processing the digital signal series in order to derive the distance to the target object therefrom, wherein:

the ADC sampling pattern defines with respect to a reception signal an initial signal sampling pattern with at least one initial sampling point of the reception signal, the reception signals of the reception signal series are temporally shifted relative to the ADC sampling pattern by means of a first temporal shift in such a way that the at least one initial sampling point is detected at least once by a first ADC conversion stage and at least once by a second ADC conversion stage, and the transmission signals are emitted on the basis of a transmission clock and the reception signals are detected on the basis of an ADC clock, wherein at least one of the following conditions is met in the context of a measuring process:

the transmission clock is asynchronous with respect to the ADC clock, the period duration of the transmission clock or a period duration of the transmission signals are different than the period duration of the ADC clock signal or than an integral multiple of the period duration of the ADC clock signal, and the transmission period $T_s$ corresponding to the transmission clock frequency or to a repetition rate of the transmission signals is given as $T_s=(n+q)*T_{ADC}$, wherein n is an integer, q is a fractional number having an absolute value of <1, and $T_{ADC}$ is the period duration of the ADC clock signal, wherein for a number of ADC conversion stages c used the condition n modulo c≠0 is met.

2. The distance measuring method of claim 1, wherein the reception signals of the reception signal series are shifted relative to the ADC sampling pattern with a defined number of first temporal shifts, wherein the number of first temporal shifts is set on the basis of at least one element of the following group:

a defined minimum number of samplings of the at least one initial sampling point by each of the ADC conversion stages used, a defined measurement accuracy for the determination of the distance, a measured signal value of the reception signal, and a predefined measurement time.

3. The distance measuring method of claim 1, wherein the reception signals of the reception signal series are shifted relative to the ADC sampling pattern with a defined number of second temporal shifts, as a result of which the sampling range is sampled with a defined number of secondary sampling points, wherein the number of secondary sampling points is set on the basis of at least one element of the following group:

a defined minimum number of mutually different secondary sampling points, a defined measurement accuracy for the determination of the distance, a measured signal value of the reception signal, and a predefined measurement time.

4. The distance measuring method of claim 1, wherein at least portions of the transmission signals as reference signals of a reference signal series pass via a reference section having a known, invariable length and are digitized by means of the ADC, wherein:

the ADC sampling pattern defines with respect to a reference signal an initial reference sampling pattern with at least one initial reference sampling point of the reference signal, the reference signals of the reference signal series are shifted relative to the ADC sampling pattern by means of the first temporal shift, such that the at least one initial reference sampling point is detected at least once by the first ADC conversion stage and at least once by the second ADC conversion stage, a reference transmission instant for the transmission signal series is derived on the basis of the digitized reference signals, a system transmission instant for the transmission signal series is derived on the basis of a system clock, and on the basis of the reference transmission instant and the system transmission instant reference time information for a determination of the first and/or second temporal shift is derived, which is taken into account during a determination of a reception instant of the reception signal series and/or the determination of the distance to the target object.

5. The distance measuring method of claim 1, wherein the relative temporal shifts are generated:

by means of shifting the transmission instants of the transmission signals, or by means of shifting the sampling instants of the reception signals.

6. The distance measuring method of claim 1, wherein:

the transmission signals are emitted on the basis of a transmission clock and an initial relative emission instant of a transmission signal is defined relative to the transmission clock, or the reception signals are detected on the basis of a reception clock and an ADC clock for the control of the ADC for detecting a sequence of reception signals is defined by the reception clock, at least one secondary relative emission instant of the transmission signal that is temporally shifted with respect to the initial relative emission instant is generated by means of a first phase shifter, or the ADC clock is temporally shifted relative to the reception clock by means of a second phase shifter.

7. An electronic laser distance measuring module for determining a distance to a target object, the electronic laser distance measuring module comprising:

an optical transmission channel having a transmitting unit for generating transmission signals of a transmission signal series;

an optical reception channel having a receiving unit for receiving at least portions of the transmission signals of the transmission signal series reflected at the target object as reception signals of a reception signal series;

a reception circuit for digitizing the reception signals of the reception signal series into digital signals of a digital signal series with an analog-to-digital converter, referred to as ADC hereinafter, with an ADC sampling pattern generated by at least two ADC conversion stages, a supervisory and control unit for determining the distance to the target object on the basis of a processing of the digital signal series, wherein:
the laser distance measuring module is configured in such a way that:
the ADC sampling pattern defines with respect to a reception signal an initial signal sampling pattern with at least one initial sampling point of the reception signal,
the reception signals of the reception signal series are temporally shifted relative to the ADC sampling pattern by means of a first temporal shift in such a way that the at least one initial sampling point is detected at least once by a first ADC conversion stage and at least once by a second ADC conversion stage, and
the transmission signals are emitted on the basis of a transmission clock and the reception signals are detected on the basis of an ADC clock, wherein at least one of the following conditions is met in the context of a measuring process:
the transmission clock is asynchronous with respect to the ADC clock,
the period duration of the transmission clock or a period duration of the transmission signals are/is different than the period duration of the ADC clock signal or than an integral multiple of the period duration of the ADC clock signal, and
the transmission period $T_s$ corresponding to the transmission clock frequency and/or to a repetition rate of the transmission signals is given as $T_s=(n+q)*T_{ADC}$, wherein n is an integer, q is a fractional number having an absolute value of between −1 and +1, and $T_{ADC}$ is the period duration of the ADC clock signal, wherein for a number of ADC conversion stages c used the condition n modulo c≠0 is met.

8. The laser distance measuring module of claim 7, wherein the laser distance measuring module is configured in such a way that the reception signals of the reception signal series are shifted relative to the ADC sampling pattern with a defined number of first temporal shifts, wherein the number of first temporal shifts is set on the basis of at least one element of the following group:
a defined minimum number of samplings of the at least one initial sampling point by each of the ADC conversion stages used,
a defined measurement accuracy for the determination of the distance,
a measured signal value of the reception signal, and
a predefined measurement time.

9. The laser distance measuring module of claim 7, wherein the laser distance measuring module is configured in such a way that the reception signals of the reception signal series are shifted relative to the ADC sampling pattern with a defined number of second temporal shifts, as a result of which the sampling range is sampled with a defined number of secondary sampling points, wherein the number of secondary sampling points is set on the basis of at least one element of the following group:
a defined minimum number of mutually different secondary sampling points,
a defined measurement accuracy for the determination of the distance,
a measured signal value of the reception signal, and
a predefined measurement time.

10. The laser distance measuring module of claim 7, wherein the laser distance measuring module is configured in such a way that at least portions of the transmission signals as reference signals of a reference signal series pass via a reference section having a known, invariable length and are digitized by means of the ADC, wherein:
the ADC sampling pattern defines with respect to a reference signal an initial reference sampling pattern with at least one initial reference sampling point of the reference signal, and
the reference signals of the reference signal series are shifted relative to the ADC sampling pattern by means of the first temporal shift, such that the at least one initial reference sampling point is detected at least once by the first ADC conversion stage and at least once by the second ADC conversion stage.

11. The laser distance measuring module of claim 7, wherein the relative temporal shifts are generated:
by means of shifting the transmission instants of the transmission signals, or
by means of shifting the sampling instants of the reception signals.

12. An electronic laser distance measuring module for determining a distance to a target object, the electronic laser distance measuring module comprising:
an optical transmission channel having a transmitting unit for generating transmission signals of a transmission signal series;
an optical reception channel having a receiving unit for receiving at least portions of the transmission signals of the transmission signal series reflected at the target object as reception signals of a reception signal series;
a reception circuit for digitizing the reception signals of the reception signal series into digital signals of a digital signal series with an analog-to-digital converter, referred to as ADC hereinafter, with an ADC sampling pattern generated by at least two ADC conversion stages, and
a supervisory and control unit for determining the distance to the target object on the basis of a processing of the digital signal series,
wherein the laser distance measuring module is configured in such a way that:
the ADC sampling pattern defines with respect to a reception signal an initial signal sampling pattern with at least one initial sampling point of the reception signal,
the reception signals of the reception signal series are temporally shifted relative to the ADC sampling pattern by means of a first temporal shift in such a way that the at least one initial sampling point is detected at least once by a first ADC conversion stage and at least once by a second ADC conversion stage,
the transmission signals are emitted on the basis of a transmission clock and an initial relative emission instant of a transmission signal is defined relative to the transmission clock, or
the reception signals are detected on the basis of a reception clock and an ADC clock for the control of the ADC for detecting a sequence of reception signals is defined by the reception clock, and
wherein:
at least one secondary relative emission instant of the transmission signal that is temporally shifted with respect to the initial relative emission instant is generated by means of a first phase shifter, or
the ADC clock is temporally shifted relative to the reception clock by means of a second phase shifter.

13. The laser distance measuring module of claim 12, wherein the laser distance measuring module is configured in such a way that at least portions of the transmission signals as reference signals of a reference signal series pass via a reference section having a known, invariable length and are digitized by means of the ADC, wherein:

the ADC sampling pattern defines with respect to a reference signal an initial reference sampling pattern with at least one initial reference sampling point of the reference signal, and the reference signals of the reference signal series are shifted relative to the ADC sampling pattern by means of the first temporal shift, such that the at least one initial reference sampling point is detected at least once by the first ADC conversion stage and at least once by the second ADC conversion stage.

* * * * *